United States Patent
Gektin et al.

(10) Patent No.: US 9,196,564 B2
(45) Date of Patent: Nov. 24, 2015

(54) APPARATUS AND METHOD FOR A BACK PLATE FOR HEAT SINK MOUNTING

(71) Applicant: FutureWei Technologies, Inc., Plano, TX (US)

(72) Inventors: Vadim Gektin, San Jose, CA (US); Youlin Jin, Santa Clara, CA (US)

(73) Assignee: Futurewei Technologies, Inc., Plano, TX (US)

( * ) Notice: Subject to any disclaimer, the term of this patent is extended or adjusted under 35 U.S.C. 154(b) by 120 days.

(21) Appl. No.: 13/864,951

(22) Filed: Apr. 17, 2013

(65) Prior Publication Data

US 2014/0262449 A1 Sep. 18, 2014

Related U.S. Application Data

(60) Provisional application No. 61/782,521, filed on Mar. 14, 2013.

(51) Int. Cl.
*H05K 1/16* (2006.01)
*H05K 1/00* (2006.01)
(Continued)

(52) U.S. Cl.
CPC .......... *H01L 23/4006* (2013.01); *H05K 1/0203* (2013.01); *H05K 1/18* (2013.01); *H05K 7/209* (2013.01); *H05K 2201/10598* (2013.01); *Y10T 29/49117* (2015.01)

(58) Field of Classification Search
CPC ... H05K 1/0203; H05K 3/341; H05K 1/0201; H05K 1/0204; H05K 1/0209; H05K 1/18; H05K 1/181; H05K 2201/10431; H05K 2201/105; H05K 2201/10537; H05K 2201/10598; H05K 2201/10606

USPC .......... 174/250–268; 361/704–720; 257/707, 257/717–719, 722

See application file for complete search history.

(56) References Cited

U.S. PATENT DOCUMENTS 5,172,755 A * 12/1992 Samarov ...................... 165/80.3
6,055,159 A 4/2000 Sun
(Continued)

FOREIGN PATENT DOCUMENTS

CN 2268232 Y 11/1997
CN 1309815 A 8/2001
(Continued)

OTHER PUBLICATIONS

International Search Report received in PCT/CN2014/073367, mailed Jun. 16, 2014, 16 pages.

*Primary Examiner* — Ishwarbhai B Patel
(74) *Attorney, Agent, or Firm* — Slater & Matsil, L.L.P.

(57) ABSTRACT

Apparatus and method embodiments are provided for a heat sink mounted on a printed circuit board using a back plate with preload. An apparatus comprises a circuit component, a heat sink on a first side of the circuit component a, a back plate having an initial curvature and positioned at a second side of the circuit component opposite to the heat sink, and one or more screws through the back plate and the circuit component and partially through the heat sink. A method further includes placing and flattening a curved back plate on a second side of a circuit board opposite to the first side, and fastening the back plate, the circuit board, and the heat sink together by inserting a plurality of screws through the back plate, the circuit board, and a partial depth on a single side of the heat sink.

12 Claims, 6 Drawing Sheets

(51) Int. Cl.
*H05K 7/20* (2006.01)
*H01L 23/40* (2006.01)
*H05K 1/02* (2006.01)
*H05K 1/18* (2006.01)

(56) References Cited

U.S. PATENT DOCUMENTS

| | | | |
|---|---|---|---|
| 6,181,006 | B1 | 1/2001 | Ahl et al. |
| 6,794,581 | B2 * | 9/2004 | Smith et al. .................. 174/260 |
| 7,289,335 | B2 * | 10/2007 | Callahan et al. ............... 361/803 |
| 7,344,296 | B2 * | 3/2008 | Matsui et al. ................. 362/652 |
| 2002/0123439 | A1 | 9/2002 | Ishitobi |
| 2004/0144561 | A1 | 7/2004 | Osanai et al. |
| 2004/0253846 | A1 | 12/2004 | Brown et al. |

FOREIGN PATENT DOCUMENTS

| | | |
|---|---|---|
| CN | 1348986 A | 5/2002 |
| CN | 1826845 A | 8/2006 |

* cited by examiner

APPARATUS AND METHOD FOR A BACK PLATE FOR HEAT SINK MOUNTING

This application claims the benefit of U.S. Provisional Patent Application Ser. No. 61/782,521, filed on Mar. 14, 2013, and entitled "An Apparatus and Method for a Back Plate for Heat Sink Mounting," which application is incorporated herein by reference.

TECHNICAL FIELD

The present invention relates to a heat sink design, and, in particular embodiments, to an apparatus and method for a back plate for heat sink mounting.

BACKGROUND

In electronic systems, a heat sink is a passive heat exchange component that cools down a device by dissipating heat into the surrounding medium, such as air. Heat sinks can be used with high-power semiconductor devices such as power transistors and optoelectronic devices such as lasers and light emitting diodes (LEDs), where the heat dissipation ability of the device package is insufficient to control its temperature. A heat sink is designed to increase the surface area in contact with the cooling medium surrounding it, such as the air. Some of the factors which affect the thermal performance of a heat sink include approach air velocity, choice of material, fin (or other protrusion) design, and surface treatment.

In computer devices, heat sinks are used to cool central processing units (CPUs) or graphics processors. For example, in different personal or mobile computer devices, heat sinks can be mounted on printed circuit boards (PCBs), via some thermal interface material. Screws with springs are inserted through the heat sink, thermal interface material, and PCB to hold and firmly affix the different components to each other, which ensures efficient heat transfer from the PCB to the heat sink. However, the screws with springs can affect the heat sink design by introducing cut off on the surface of the heat sink and reducing the space for the fins (or other protrusions), which can reduce overall heat dissipation and thus cause degradation to device performance.

SUMMARY OF THE INVENTION

In one embodiment, an apparatus for a mounted heat sink comprises a circuit component, a heat sink mounted on a first side of the circuit component and comprising a base and a plurality of fins on the base, a back plate having an initial curvature and positioned at a second side of the circuit component opposite to the heat sink, and one or more screws inserted through the back plate and the circuit component and partially through the heat sink at a partial depth of the base.

In another embodiment, a method for mounting a heat sink on a circuit board, the method includes placing a heat sink on a first side of a circuit board, placing a back plate that has an initial curved shape on a second side of the circuit board opposite to the first side, and fastening the back plate, the circuit board, and the heat sink together by inserting a plurality of screws through the back plate, the circuit board, and a partial depth on a single side of the heat sink.

In yet another embodiment, an apparatus for a mounted heat sink comprises a printed circuit board (PCB), a heat sink mounted on one side of the PCB, a curved shaped back plate placed at an opposite side of the PCB, and a plurality of screws that penetrate through the back plate and the PCB and partially through the heat sink, wherein the back plate, the PCB, and the heat sink are fastened together via the screws and a preload introduced by the curved shaped back plate.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

Figure 1:
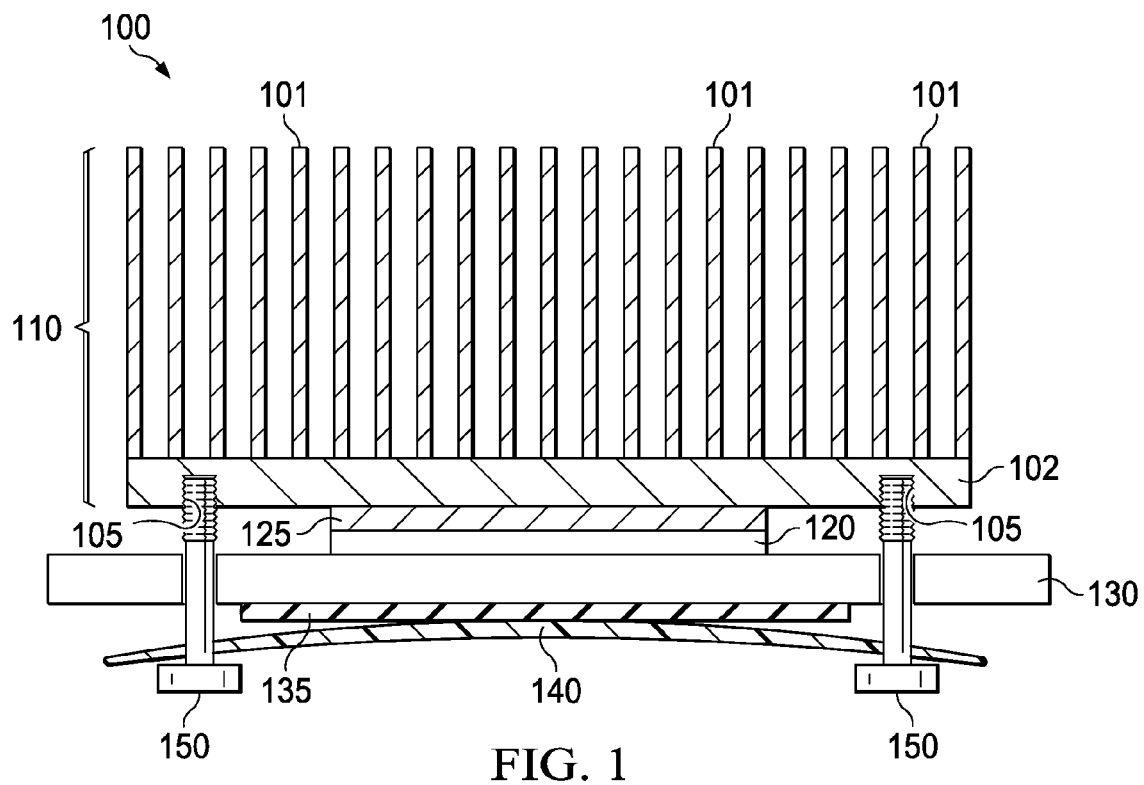
FIG. 1 illustrates an embodiment of a heat sink design with back plate mounting.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Apparatus and method embodiments are provided for a heat sink mounted on a printed circuit board (PCB) using a back plate. The heat sink is mounted on one side or surface of the PCB while the back plate is place on the other side or surface of the PCB. Screws are used to hold or press the components tightly together. The screws extend through the back plate, the PCB, and a limited depth into the heat sink without piercing or cutting through the surface of the heat sink on the opposite side from the PCB. The surface includes fins (or other protrusions) surrounded by a heat dissipating medium, such as air. Further, a thermal interface material (TIM) can be positioned between the package on PCB and the heat sink to enhance heat transfer from the package on PCB to the heat sink.

The back plate of the heat sink is designed to apply a pressure or preload on one side of the PCB sufficient to hold tightly and firmly the heat sink to package on the other side of the PCB. The term preload is used herein to indicate a load (or force) applied as a result of fastening the back plate to the remaining components in the manner described herein. Specifically, the back plate has an initial curvature design with some mechanical flexibility (or elasticity) to bend. The back plate is placed on the PCB's surface with the back plate's curvature facing opposite to the surface. The back plate is then bent or flattened by a sufficient degree to achieve this preload and screwed into the heat sink. As such, the back plate applies a preload that is sufficient to press the different components of the heat sink/TIM/package/PCB assembly firmly and tightly together to minimize gaps or spaces (e.g., air gaps) between the adjacent surfaces of the components. This ensures efficient heat flow from the package on PCB to the air exposed surface (or the fin surface) of the heat sink. This also assures electrical connections between the package and the PCB, for instance when electrical connections are of a press type, such as an interposer, or similar.

Due to this back plate preload and holding effect, no springs are needed or used with the screws, such as in the case of typical heat sink mounting designs. This aspect reduces cost, improves heat flow in the absence of heat flow resistance due to the springs, and simplifies the heat sink mounting process. Further, there is no need for the screws to protrude or reach the air exposed surface of the heat sink (with the fins or protrusions) on the opposite side from the PCB, and therefore there are no surface cuts that could affect or reduce the heat exchange performance of the fins or protrusions. This aspect improves heat dissipation and further simplifies the heat sink mounting process. The back plate mounting approach can also be used to mount heat sinks to components other than the package on PCB, such as other circuit components, electronic chips, optic boards, or other suitable structures.

FIG. 1 shows an embodiment of a heat sink design 100 with back plate mounting. The heat sink design 100 includes a heat sink 110 on a PCB 130. A package 120 component or structure (e.g., a plate or board) is positioned between the heat sink 110 and the PCB 130. A back plate 140 is affixed to the PCB 130 on the opposite side from the package 120 and the heat sink 110. The heat sink 110 comprises a base 102 portion and a plurality of fins 101 or otherwise shaped protrusions on the base 102. The back plate 140 has a curved surface in the direction opposite to the PCB 130. The back plate 140 can be made of any suitable flexible or bendable material, such as a metal or plastic. The TIM 125 may be any material that has substantially or relatively high thermal conductivity, for instance higher than the circuit PCB 130 or matching that of the heat sink 110. An insulating pad 135 can also be positioned between the back plate 140 and the PCB 130. The insulating pad 135 is an electrical insulator that prevents electrical shorting of the contacts of the back of the PCB 130, if the back plate 140 is electrically conductive. The insulating pad 135 may be any material that is electrically isolating and thin, for example, Mylar.

Further, a plurality of screws 150 are used to fasten the remaining components together. The screws 150 are inserted through the back plate 150 and the PCB 130, and partially through the heat sink 110, as shown in FIG. 1. Specifically, the screws 150 are inserted through corresponding openings 105 (e.g., holes) in the surface of the heat sink 110 facing the TIM 125 and the PCB 230. The openings 105 at that surface do not reach the other surface of the heat sink 110. The openings 105 (and the screws 150) do not extend to the top surface, where the heat sink fins 101 are exposed to air (or other heat releasing medium) on the opposite side from the package 120 and the PCB 130. In various embodiments, the screws 150 may or may not penetrate or pass through the pad 140 and/or the TIM 125.

As described above, the back plate 140 with the screws 150 apply the preload needed to hold the components above tightly to each other. Any suitable number of screws 150 may be used to affix the components above together. The screws may be distributed symmetrically (or at about equal distance from each other) at the edges or corners of the back plate 140, the PCB 130, and/or the heat sink 110. For instance, the back plate 140, the PCB 130, and/or the heat sink 110 may have a square or rectangular geometry, and hence four screws 150 are inserted at the corners of the back plate 140, the PCB 130, and/or the heat sink 110. Alternatively, the back plate 140, the PCB 130, and/or the heat sink 110 may have a different geometry, such as a circular geometry, and hence a suitable number of screws 130 is inserted at about equal distance from each other at the edges of the components.

Figure 2A:
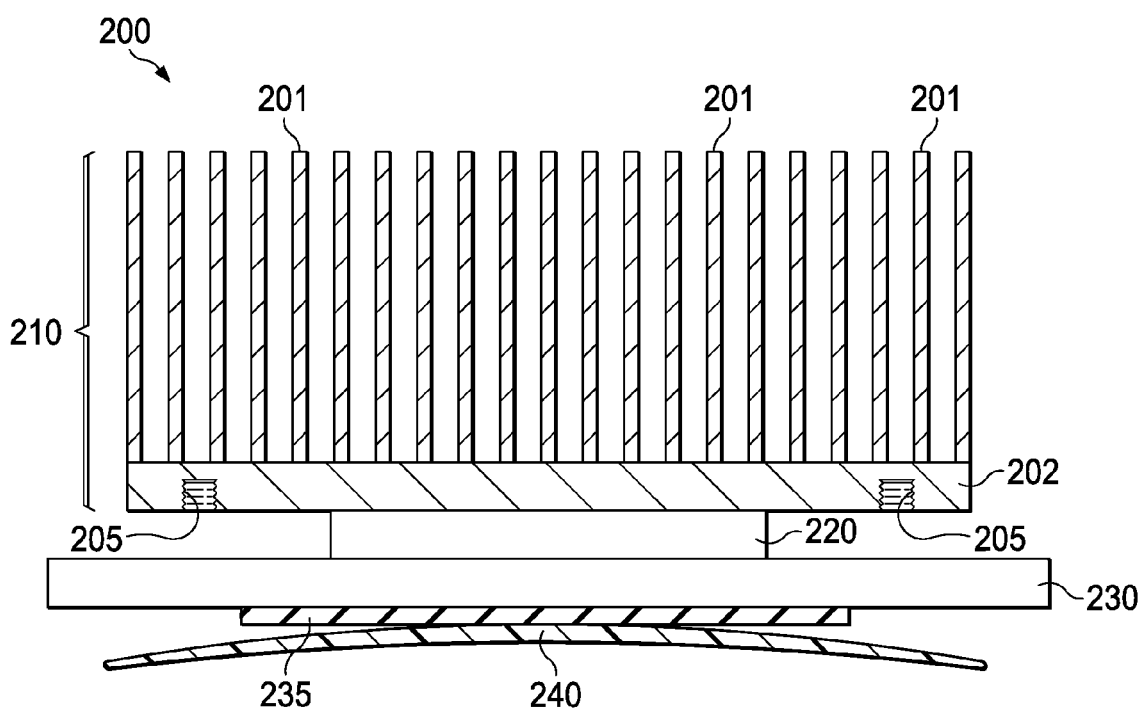
FIGS. 2A, 2B and 2C illustrate three respective embodiment steps for mounting a heat sink on a PCB using a back plate.
Figure 2B:
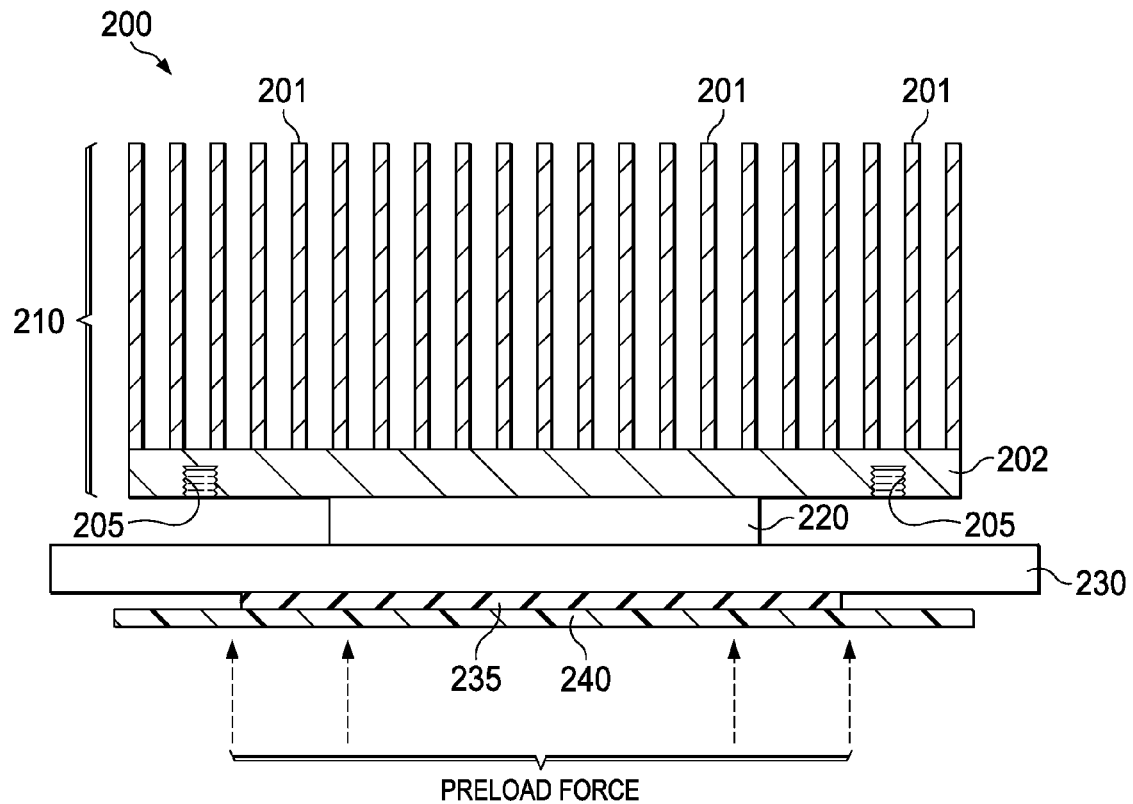
Figure 2C:
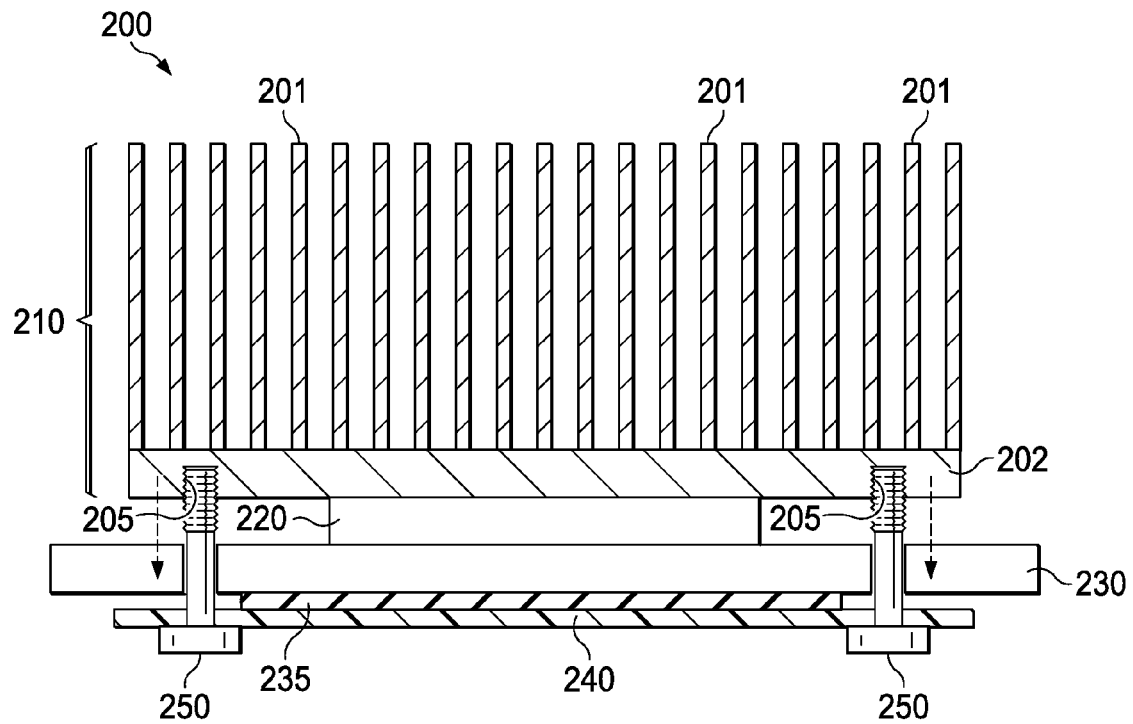

FIGS. 2A, 2B and 2C show three respective steps of an embodiment method 200 including steps for mounting a heat sink on a PCB using a back plate. For instance, the method 200 can be used to obtain the heat sink design 100. FIG. 2A shows a step of mounting the components of the heat sink design. A package 220 is mounted on a PCB 230. A heat sink 210 is then mounted onto the package 220. A plurality of holes or openings 205 are made or drilled at one surface of the base 202 of the heat sink 210 facing the package 220 and the PCB 230. The openings 205 do not reach the top surface of the base 202 or the fins 201. The number of openings 205 matches the number of screws that will be used to join the components. The openings 205 may be created before positioning the heat sink 210, with the openings 205 facing downwards, onto the package 220. An insulating pad 235 is also attached to the PCB 230 on the opposite side or surface of the PCB 230 from the package 220 and a heat sink 210. A back plate 240 with a curved surface is then attached to the insulating pad 235 on the opposite side or surface of the insulating pad 235 from the PCB 230. The back plate 240 is mounted such that the curved surface faces apposite to the PCB 230 (e.g., bent downwards in FIG. 2A).

FIG. 2B shows a step of applying pressure or preload to the back plate 240. The pressure is applied on one side or surface of the back plate 240 (opposite to the PCB 230) by bending the flexible back plate 240 to flatten the curved surface substantially or as much as possible (e.g., without breaking the back plate 240). FIG. 2C shows a step of holding the different components together using a plurality of screws 250. The back plate 240 and the PCB 230 are drilled to create, in these components, openings aligned with the openings 205 of the heat sink 210. The screws 250 are then inserted through the openings in the back plate 240 and the PCB 230 and the openings 205 in the heat sink 210. The screws 250 are screwed in as such to maintain the flattened surface of the back plate 240 and hold the components firmly together. This prevents the surface of the back plate 240 to revert to a curved surface and applies a force, referred to herein as preload, which pulls down on the heat sink 210 with the screws 250 towards the PCB 230, thus forcing the components to hold tightly together. This also removes or reduces the inter-component gaps between the adjacent surfaces of the different components.

Figure 3A:
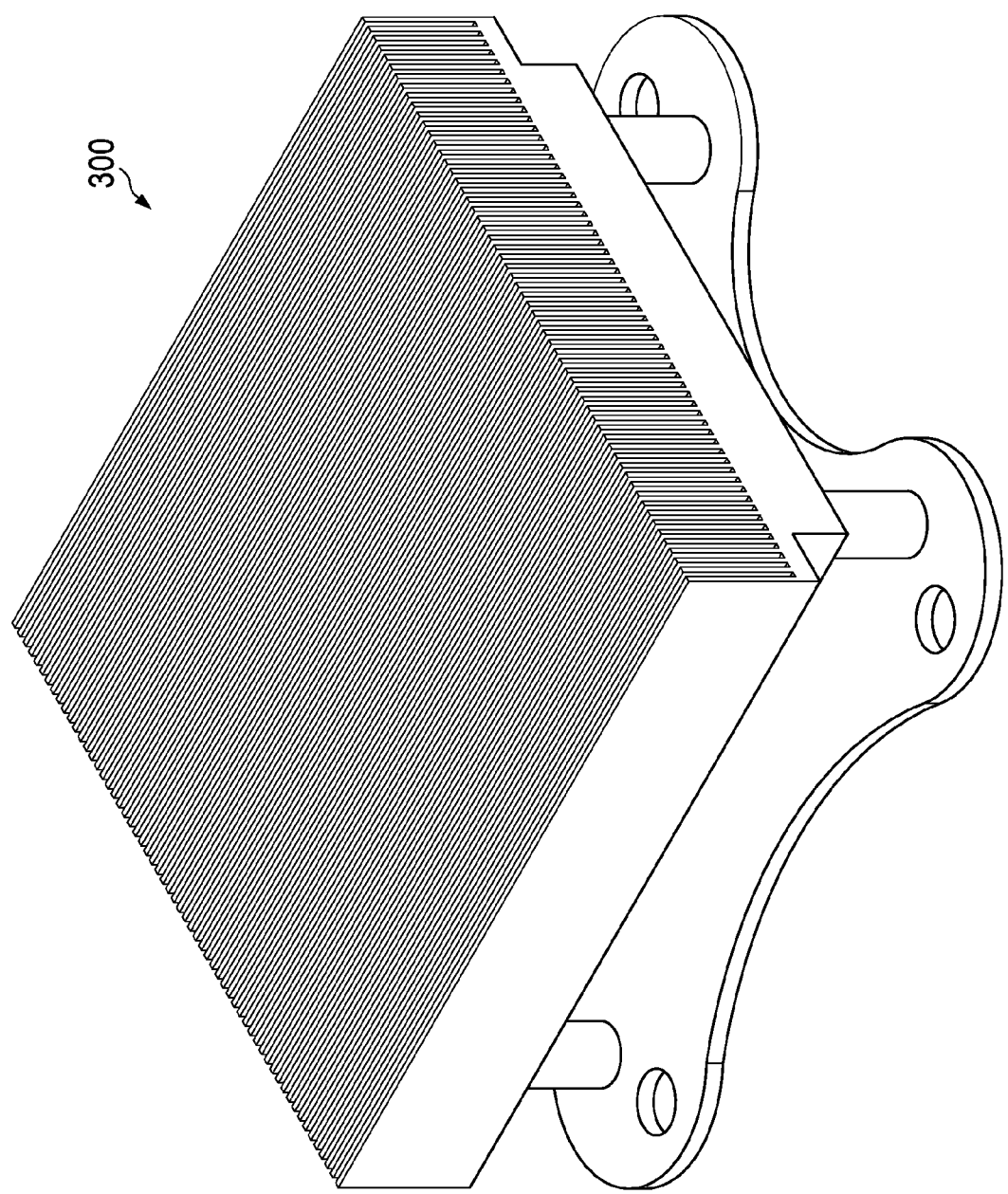
FIG. 3A illustrates an embodiment heat sink mounted on a PCB via a back plate.
Figure 3B:
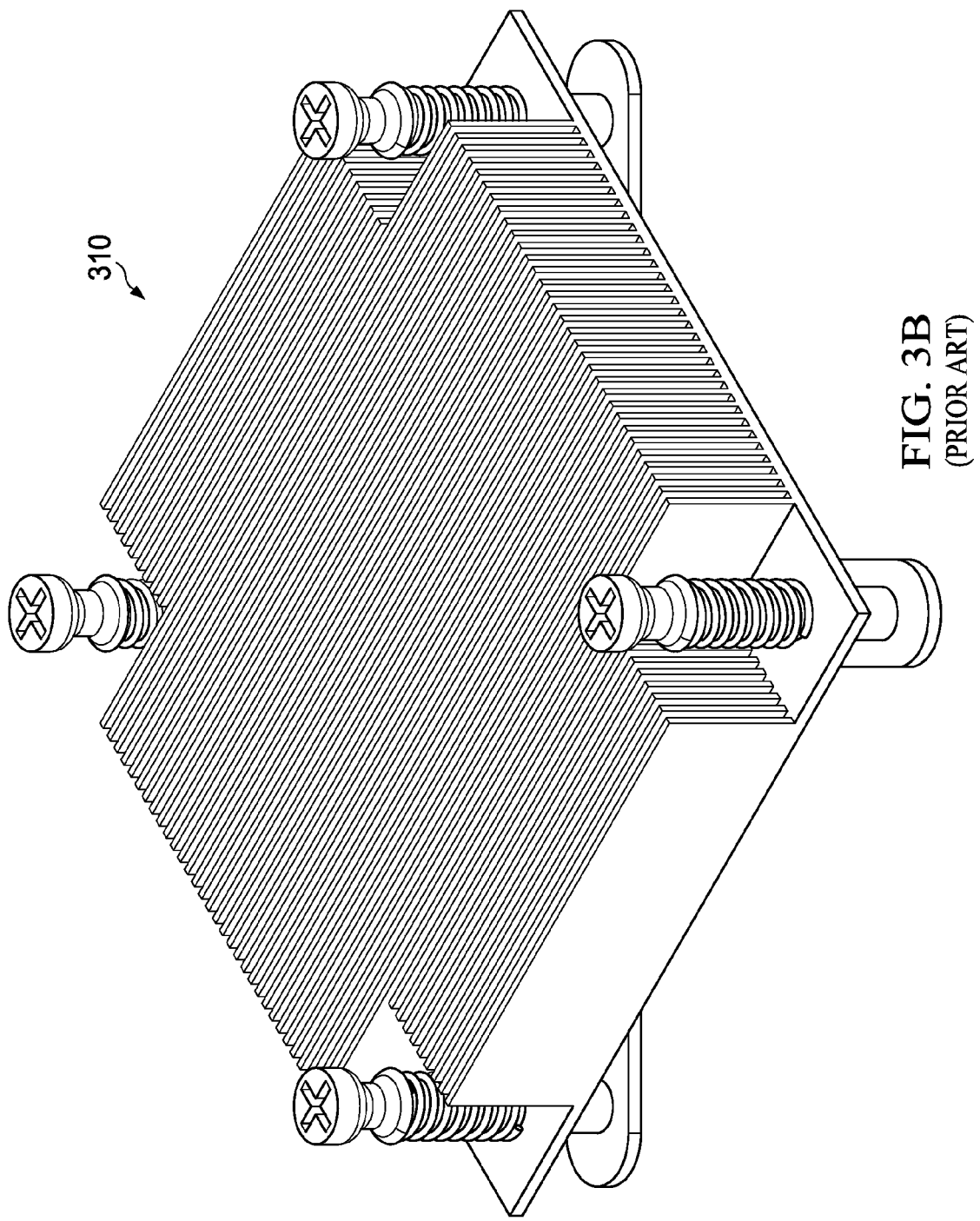
FIGS. 3B, 3C and 3D illustrate examples of typical PCB mounted heat sink designs.
Figure 3C:
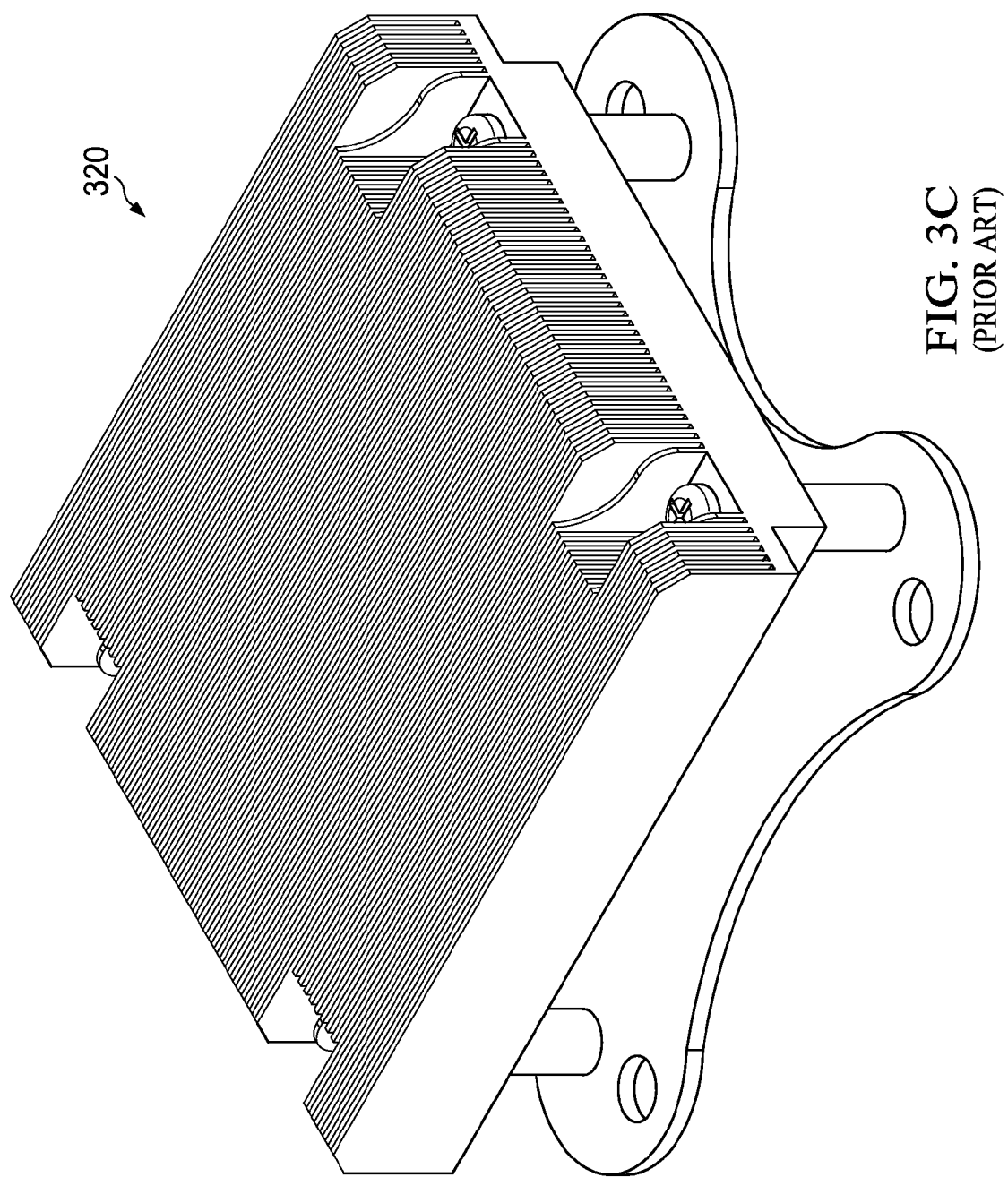
Figure 3D:
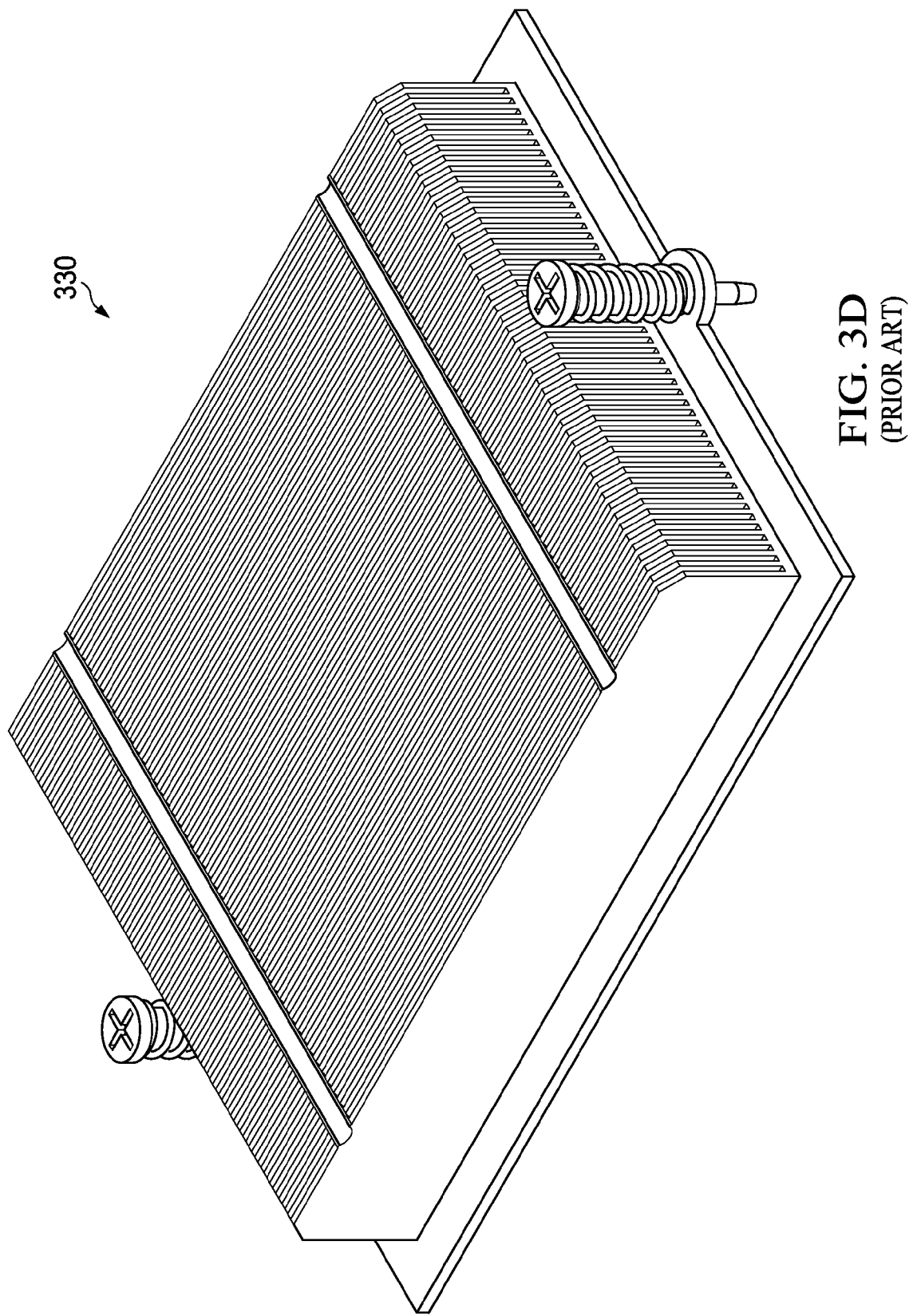

FIG. 3A shows a heat sink design 300 with back plate mounting according to an embodiment herein. In comparison, FIGS. 3B, 3C and 3D show examples of typical PCB mounted heat sink designs 310, 320 and 330, respectively. The design 300 includes a back plate to mount the PCB to the heat sink without springs and without cutting the surface and fins on top of the heat sink. The design 300 may be similar to the design 100 or may be achieved using the steps of the method 200. The designs 310, 320, and 330 include screws with springs that are used to mount heat sinks on PCBs or similar components and hold them together. In all the designs above, other components may also be included between or adjacent to the heat sinks and the PCBs.

In designs 310 and 320, the screws extend the top surface of the heat sink, which requires cuttings of the fins to allow the space at the surface for the screws. This reduces the heat dissipation efficiency (e.g., per surface area) of the overall design in comparison to the design 300 (where there are no cuts). In design 330, the screws with springs are inserted on the sides of the heat sinks and do not affect the fin and top surface design of the heat sink. However, this may result in less force or pressure (than the other designs) to hold the components closer together, which reduces heat transfer efficiency in comparison to design 300.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus for a mounted heat sink comprising:
a circuit component;
a heat sink mounted on a first side of the circuit component and comprising a base and a plurality of fins on the base;
a back plate having an initial curvature and positioned at a second side of the circuit component opposite to the heat sink;
one or more screws inserted through the back plate and the circuit component and partially through the heat sink at a partial depth of the base; and
an insulating pad positioned between the circuit component and the back plate, wherein a first side of the insulating pad is in direct contact with the circuit component, and a second side of the insulating pad opposite to the first side is in direct contact with the back plate.

2. The apparatus of claim 1, wherein the initial curvature faces opposite from the circuit component.

3. The apparatus of claim 1, wherein a curved shape of the back plate is substantially flattened at the second side of the circuit component via a pressure of the screws.

4. The apparatus of claim 3 further comprising a component positioned between the heat sink and the circuit component and held via the pressure from the screws.

5. The apparatus of claim 1, wherein the circuit component is a printed circuit board (PCB).

6. The apparatus of claim 1, wherein the circuit component, the heat sink, and the back plate have a rectangular or close to a rectangular shape, and wherein four screws are placed at four corners through each of the back plate, the circuit component, and the base of the heat sink.

7. An apparatus for a mounted heat sink comprising:
a printed circuit board (PCB);
a heat sink mounted on one side of the PCB;
a curved shaped back plate placed at an opposite side of the PCB; and
a plurality of screws that penetrate through the back plate and the PCB and partially through the heat sink, wherein the back plate, the PCB, and the heat sink are fastened together via the screws and a preload introduced by the curved shaped back plate; and
an insulating pad positioned between the PCB and the curved back plate, wherein a first side of the insulating pad is in direct contact with the PCB, and a second side of the insulating pad opposite to the first side is in direct contact with the back plate.

8. The apparatus of claim 7, wherein the curved shaped back plate has a degree of mechanical elasticity that allows flattening the curved shaped back plate via the screws to introduce the preload.

9. The apparatus of claim 7, wherein the curved shaped back plate has a curvature facing away from the PCB, and wherein the curvature is flattened towards the PCB via the screws.

10. The apparatus of claim 7, wherein the back plate, the PCB, and the heat sink are fastened together without using springs.

11. The apparatus of claim 7, wherein the heat sink comprises a base facing the PCB and a plurality of fins on an opposite surface of the base from the PCB, and wherein the screws penetrate a portion of the base without reaching the opposite surface of the base.

12. The apparatus of claim 11, wherein none of the fins on the opposite surface of the base are cut.

* * * * *